United States Patent
Dai et al.

(10) Patent No.: US 10,116,314 B1
(45) Date of Patent: Oct. 30, 2018

(54) MULTI-MODE FREQUENCY DIVIDER

(71) Applicant: Nvidia Corporation, Santa Clara, CA (US)

(72) Inventors: Dai Dai, San Jose, CA (US); Ola Oluwole, Mountain View, CA (US); Srikanth Sundaram, Spring, TX (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 15/801,208

(22) Filed: Nov. 1, 2017

(51) Int. Cl.
*H03L 7/06* (2006.01)
*H03L 7/099* (2006.01)
*H03L 7/089* (2006.01)
*H03L 7/091* (2006.01)

(52) U.S. Cl.
CPC .......... *H03L 7/0992* (2013.01); *H03L 7/0891* (2013.01); *H03L 7/091* (2013.01)

(58) Field of Classification Search
USPC ................................ 327/147–149, 156–159
See application file for complete search history.

(56) References Cited

U.S. PATENT DOCUMENTS

| | | | |
|---|---|---|---|
| 6,836,169 B2 | 12/2004 | Richmond et al. | |
| 7,054,404 B2 | 5/2006 | Saeki | |
| 7,388,939 B2 | 6/2008 | Dubash et al. | |
| 7,719,326 B2 | 5/2010 | Casagrande et al. | |
| 7,741,926 B2 * | 6/2010 | Kodama | H03B 21/02 332/100 |
| 7,924,069 B2 | 4/2011 | Narathong et al. | |
| 8,004,320 B2 | 8/2011 | Yang | |
| 8,280,934 B2 | 10/2012 | Molnar et al. | |
| 8,299,827 B2 | 10/2012 | Subburaj et al. | |
| 8,675,810 B2 | 3/2014 | Martin | |
| 9,270,280 B1 | 2/2016 | Margarit et al. | |
| 9,306,574 B1 | 4/2016 | Zhao et al. | |
| 9,748,961 B2 * | 8/2017 | Cali | H03L 7/1974 |
| 9,900,012 B2 * | 2/2018 | Cali | H03K 21/026 |
| 2005/0280473 A1 * | 12/2005 | Puma | H03C 3/0925 331/16 |

(Continued)

OTHER PUBLICATIONS

Ranganathan Desikachari, High-Speed CMOS Dual-Modulus Prescalers for Frequency Synthesis, A Thesis submitted to Oregon State University, Oct. 1, 2003, 71 pages.

(Continued)

*Primary Examiner* — Adam Houston

(57) ABSTRACT

A frequency divider includes first circuitry, second circuitry, and third circuitry. The first circuitry includes divide-by-two (div2) frequency divider circuitry, and the second circuitry includes additional circuitry for a divide-by-three (div3) frequency divider. The second circuitry is selectively enabled using a control signal and can receive signals from the first circuitry when enabled. Specifically, the second circuitry is enabled in the div3 mode but is not enabled in the div2 mode. The third circuitry receives signals from the first circuitry and also receives signals from the second circuitry when the second circuitry is enabled. The first circuitry and the third circuitry function as a div2 frequency divider when the second circuitry is not enabled. The first circuitry, the second circuitry, and the third circuitry function as a div3 frequency divider when the second circuitry is enabled.

20 Claims, 6 Drawing Sheets

(56) References Cited

U.S. PATENT DOCUMENTS

| | | | |
|---|---|---|---|
| 2009/0061804 A1* | 3/2009 | Chang | H03L 7/099 |
| | | | 455/260 |
| 2011/0148480 A1 | 6/2011 | Fan | |
| 2012/0045023 A1* | 2/2012 | Casagrande | H04L 27/1525 |
| | | | 375/334 |
| 2012/0068745 A1* | 3/2012 | Hsieh | H03L 7/18 |
| | | | 327/157 |
| 2014/0003569 A1* | 1/2014 | Martin | H03K 21/08 |
| | | | 377/48 |
| 2014/0003570 A1 | 1/2014 | Terrovitis | |
| 2015/0229317 A1* | 8/2015 | Juneau | H03L 7/18 |
| | | | 327/105 |
| 2015/0341042 A1* | 11/2015 | Balachandran | H03L 7/099 |
| | | | 327/156 |
| 2016/0072509 A1 | 3/2016 | Jia | |
| 2016/0373121 A1* | 12/2016 | Lee | H03L 7/093 |
| 2017/0005786 A1* | 1/2017 | Perdoor | H04L 7/0331 |
| 2017/0041005 A1* | 2/2017 | Pandita | H03L 7/18 |

OTHER PUBLICATIONS

Michael Perrott, High-Sped Communication Circuits and Systems Lecture 14 High Speed Frequency Dividers, Mit Open CourseWare, Oct. 2003, 46 Pages.

Yu-Che Yang, Shih-An Yu, Tao Wang, and Shey-Shi Lu, A Dual-ModeTruly Modular Programmable Fractional Divider Based on a 1/1.5 Divider Cell, IEEE Microwave and Wireless Components Letters, vol. 15, No. 11, Nov. 2005, 3 pages.

* cited by examiner

MULTI-MODE FREQUENCY DIVIDER

BACKGROUND

FIG. 1 is a block diagram illustrating a phase-locked loop (PLL) 100. The PLL 100 includes a voltage-controlled oscillator (VCO) and a frequency divider along with other components such as an N-divider, a phase frequency detector (PFD), a charge pump (CP), and a low-pass filter (LPF). In most cases, the PLL frequency is directly determined by its VCO tuning range, and a divide-by-two (div2) or divide-by-four (div4) frequency divider is used to generate an I/Q (in-phase/quadrature) clock at, respectively, half of or a quarter of the VCO frequency.

However, when the frequency range is relatively large and the VCO cannot achieve a two times (2X) tuning range without sacrificing power and phase noise performance, there can be a gap in the frequencies that can be provided by the PLL, especially at higher frequencies. For example, if the VCO has a frequency range of 14-21 gigahertz (GHz), then a div2 frequency divider will provide a frequency range of 7-10.5 GHz and a div4 frequency divider will provide a frequency range of 3.5-5.25 GHz, leaving a gap in the range of 5.25-7 GHz.

Some conventional PLL designs that require a quadrature clock solve this problem by incorporating multiple VCOs, each covering a different frequency range. However, the circuit overhead for those types of designs is large because they require extra clocks and extra multiplexers. Also, if inductor-capacitor (LC) VCOs are used, then the size of the PLL can be problematic because each LC VCO needs its own inductor coil and the inductor coils need to be spaced far enough apart from each other to eliminate any undesirable coupling effects.

Other conventional PLL designs employ a divide-by-three (div3) frequency divider to bridge the frequency gap with a single VCO. However, conventional div3 frequency dividers provide neither the preferred 50 percent duty cycle nor the preferred quadrature phase when the frequency is divided by three. Some designs use injection-locking div3 circuits to generate a 50 percent duty cycle with a passive polyphase filter for quadrature phase generation, but these can be problematic because they can only provide a narrow operating frequency range and do not suit applications in the 1.5× tuning range, which corresponds to the gap between divide-by-two and divide-by-four.

SUMMARY

Embodiments according to the invention include a configurable divide-by-two (div2) and divide-by-three (div3) multi-mode frequency divider that includes an integrated circuit and an edge-combining and interpolation circuit. Thus, embodiments according to the invention can be used as either a div2 frequency divider or a div3 frequency divider in a phase-locked loop (PLL). A control signal is used to select either the div2 mode or the div3 mode.

In an embodiment, the frequency divider includes first circuitry, second circuitry, and third circuitry. The first circuitry includes div2 frequency divider circuitry, and the second circuitry includes additional circuitry for a div3 frequency divider. The third circuitry includes the edge-combining and interpolation circuit. The second circuitry is selectively enabled using the aforementioned control signal and can receive signals from the first circuitry when enabled. Specifically, the second circuitry is enabled in the div3 mode but is not enabled in the div2 mode. The third circuitry receives signals from the first circuitry and also receives signals from the second circuitry when the second circuitry is enabled. The first circuitry and the third circuitry function as a div2 frequency divider when the second circuitry is not enabled. The first circuitry, the second circuitry, and the third circuitry function as a div3 frequency divider when the second circuitry is enabled.

The third circuitry includes capacitors that receive outputs of the logic circuit elements. The capacitances of the capacitors are programmable. The capacitances are selected according to the frequency of the oscillator (e.g., a voltage-controlled oscillator or a digitally controlled oscillator) in the PLL. The capacitances can be changed in response to a change in the frequency.

In an embodiment, the third circuitry includes logic circuit elements (e.g., NOR gates) that receive the signals from the first circuitry and that also receive the signals from the second circuitry when the second circuitry is enabled. The third circuitry can also include single-ended-to-differential converters that receive outputs from the logic circuit elements. Each of the single-ended-to-differential converters includes a single input and two differential outputs. The third circuitry can also include multiplexers that receive the outputs from the single-ended-to-differential converters. The multiplexers also receive the aforementioned control signal and the signals from the first circuitry. The control signal causes the multiplexers to select the signals from the first circuitry when the second circuitry is not enabled (in the div2 mode) and causes the multiplexers to select the outputs from the single-ended-to-differential converters when the second circuitry is enabled (in the div3 mode). The signals from the first circuitry have a 50 percent duty cycle in quadrature phase and a frequency that is the frequency of the oscillator divided by two. The outputs from the single-ended-to-differential converters have a 50 percent duty cycle in quadrature phase and a frequency that is the frequency of the oscillator divided by three.

Thus, embodiments according to the present invention provide a solution to the problems described above. For example, the output frequency ranges of PLLs can be expanded even with a limited VCO turning range. Because multiple VCOs are not needed, the associated problems with circuit overhead and PLL size are resolved. The multi-mode frequency divider can be implemented as a complementary metal-oxide-semiconductor (CMOS) device, which can reduce power consumption. Significantly, frequency gaps such as the one described above are eliminated.

Embodiments according to the present invention can be used in a variety of different wireline standards including PCIE (Peripheral Component Interconnect Express), SATA (Serial Advanced Technology Attachment), USB (Universal Serial Bus), M-PHY, and NVLink.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations in a system or device such as a phase-locked loop (PLL) or frequency divider. These descriptions and representations are the means used by those skilled in the related arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving," "sending," "selecting," "controlling," "enabling," "changing," "dividing," or the like, refer to actions and processes (e.g., the flowcharts 700 and 800 of FIGS. 7 and 8) of a system or device (e.g., a PLL or frequency divider).

Figure 1:
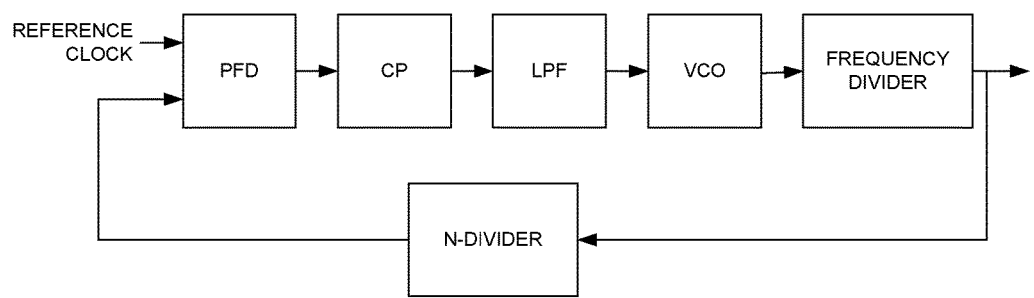
FIG. 1 is a block diagram illustrating a conventional phase-locked loop (PLL).
Figure 2:
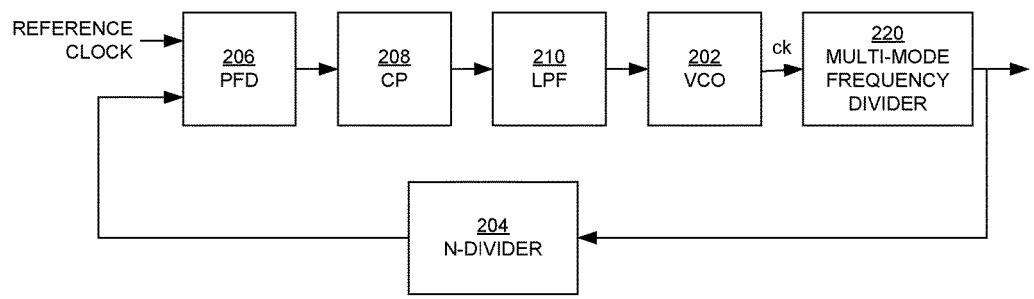
FIG. 2 is a block diagram illustrating a PLL in an embodiment according to the present invention.

FIG. 2 is a block diagram illustrating a PLL 200 in an embodiment according to the present invention. In the example of FIG. 2, the PLL 200 includes an oscillator 202 (e.g., a voltage-controlled oscillator, VCO, or a digitally controlled oscillator, DCO) and other components such as, but not limited to, an N-divider 204, a phase frequency detector (PFD) 206, a charge pump (CP) 208, and a low-pass filter (LPF) 210.

Significantly, and advantageously, the PLL 200 includes a multi-mode frequency divider 220. In embodiments according to the invention, the frequency divider 220 can operate in different modes: as a divide-by-two (div2) frequency divider in div2 mode (which may be referred to herein as the "first mode") and as a divide-by-three (div3) frequency divider in div3 mode (which may be referred to herein as the "second mode"). Also, with additional circuitry (not shown), the frequency divider 220 can operate in more than two modes. For example, with the addition of another div2 frequency divider, the frequency divider 220 can operate as a divide-by-four frequency divider and/or as a divide-by-six frequency divider. The frequency divider 220 can be implemented as a complementary metal-oxide-semiconductor (CMOS) device, which can reduce power consumption.

Figure 3:
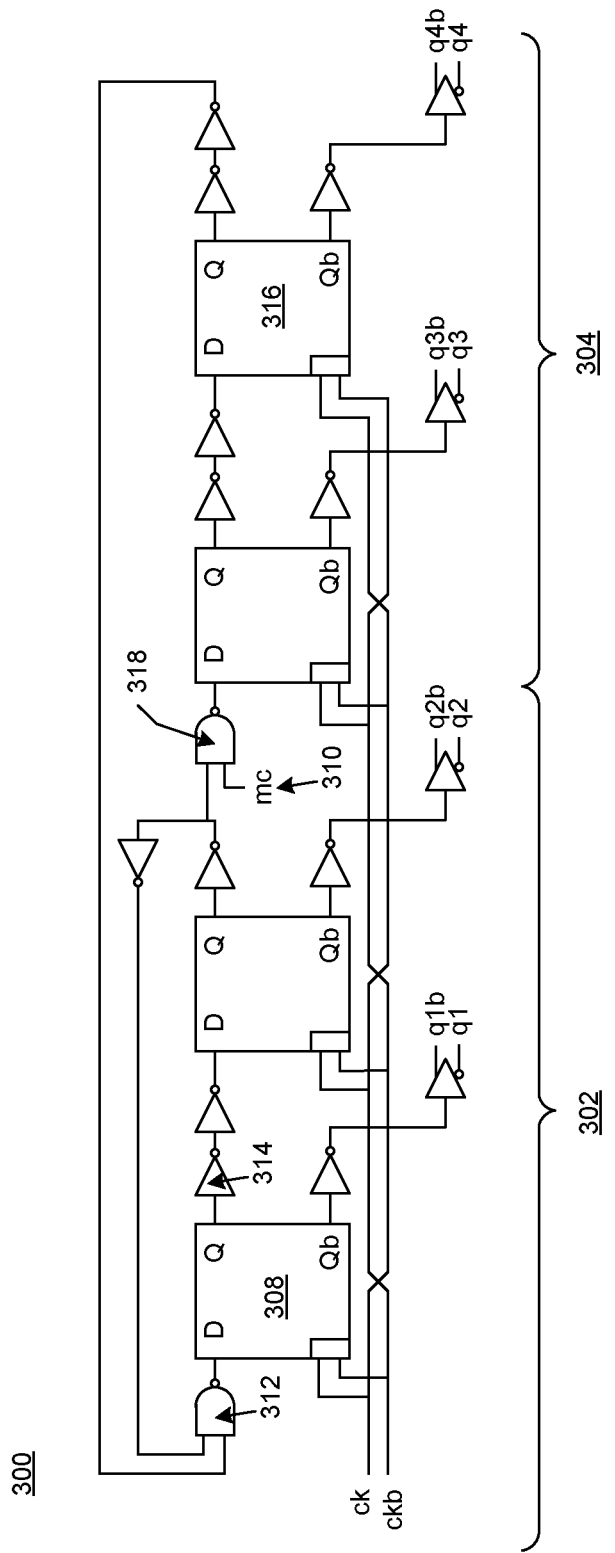
FIGS. 3 and 4 illustrate circuitry in a frequency divider in embodiments according to the present invention.
Figure 4:
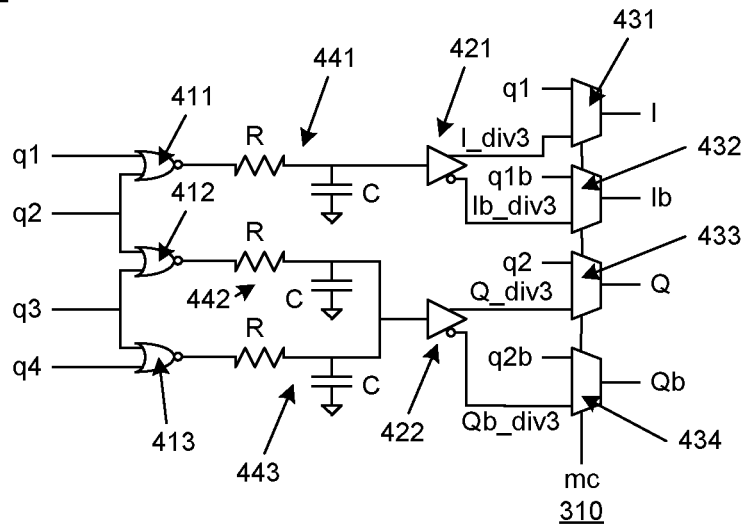

FIGS. 3 and 4 illustrate circuitry in the multi-mode frequency divider 220 in embodiments according to the present invention. That is, the frequency divider 220 includes the circuitry 300 of FIG. 3 and the circuitry 400 of FIG. 4. As will be described and as shown in these two figures, outputs of the circuitry 300 are inputs to the circuitry 400. The signals that are inputs to the circuitry 400 depend on whether the frequency divider 220 is operating in the div2 mode or the div3 mode.

In FIG. 3, the portion labeled 302 (which may be referred to herein as "first circuitry") constitutes a div2 frequency divider, and the portion labeled 304 constitutes additional circuitry (which may be referred to herein as "second circuitry") for a div3 frequency divider. The second circuitry 304 is selectively enabled using a control signal (mc) 310 and can receive signals from the first circuitry 302 when enabled. Specifically, the second circuitry is enabled in the div3 mode but is not enabled in the div2 mode. The control signal 310 is used to select (enable) the additional circuitry (the second circuitry 304) when a div3 frequency divider is needed (when operating in div3 mode), and to deselect (not enable) that portion when it is not needed (when operating in div2 mode).

The circuitry 300 includes four latches (e.g., latches 308 and 316) coupled by NAND gates and inverters (e.g., NAND gates 312 and 318 and inverter 314) as shown. The first circuitry 302 is coupled to the second circuitry 304 by the NAND gate 310, which also receives the control signal 310. When the second circuitry 304 is enabled (in div3 mode), the signal that is output from the NAND gate 318 is input to the first latch 316 of the second circuitry. The outputs of the latches (outputs q1, q1b, q2, q2b, q3, q3b, q4, and q4b) are input to the edge-combining and interpolation circuit 400 of FIG. 4 (which may be referred to herein as "third circuitry").

The third circuitry 400 receives signals from the first circuitry 302 and also receives signals from the second circuitry 304 when the second circuitry is enabled. As noted above, in div2 mode, the second circuitry 304 is not enabled and so the inputs to the circuit 400 include only q1, q1b, q2, and q2b. However, in div3 mode, the second circuitry 304 is enabled so that the inputs to the circuit 400 can include q1, q1b, q2, q2b, q3, q3b, q4, and q4b.

Thus, the first circuitry 302 and the third circuitry 400 function as a div2 frequency divider when the second circuitry 304 is not enabled. The first circuitry 302, the second circuitry 304, and the third circuitry 400 function as a div3 frequency divider when the second circuitry is enabled.

In FIG. 4, the outputs q1, q2, q3, and q4 of the circuitry 300 are input to the NOR gates 411, 412, and 413 as shown. The outputs of the NOR gates 411, 412, and 413 are input to the single-ended-to-differential converters 421 and 422. Each of the single-ended-to-differential converters 421 and 422 has a single input and two differential clock outputs. The outputs of the differential converters 421 and 422 are provided to the multiplexers (MUXs) 431, 432, 433, and 434. The MUXs 431, 432, 433, and 434 also receive q1, q1b, q2, and q2b directly from the circuitry 300 of FIG. 3. The control signal 310 controls the MUXs depending on whether div2 mode or div3 mode is being implemented.

In div2 mode, control signal 310 causes the MUXs 431, 432, 433, and 434 to select the outputs q1, q1b, q2, and q2b of the first circuitry 302. In div3 mode, the control signal 310 causes the MUXs 431, 432, 433, and 434 to select the outputs of single-ended-to-differential converters 421 and 422. The signals from the first circuitry 302 have a 50 percent duty cycle in quadrature phase and a frequency that is the input frequency (the oscillator 202 frequency) divided by two. In div3 mode, the 50 percent duty cycle clock is generated based on a 33 percent duty cycle clock from the div3 frequency divider (the second circuitry 304), and a CMOS interpolator (the third circuitry 400) then generates a quadrature clock (Q) based on signals that are 60 degrees and 120 degrees away from the in-phase clock (I). The outputs from the single-ended-to-differential converters 421 and 422 have a 50 percent duty cycle in quadrature phase and a frequency that is the input frequency (the oscillator 202 frequency) divided by three. Thus, in both div2 mode and div3 mode, the signals that are output from the frequency divider 220 are quadrature (four phase) signals and have a 50 percent duty cycle.

The signals are filtered for better interpolation. Operations are based on clock edges, making the design insensitive to the incoming clock frequency.

The circuitry 400 also includes resistors (R) and capacitors (C) (RC filters 441, 442, and 443) between the NOR gates 411, 412, and 413 and the single-ended-to-differential converters 421 and 422. Significantly, the amount of capacitance in each of the RC filters 441, 442, and 443 is programmable, to select an amount that corresponds to the input frequency of the frequency divider 220 (the output frequency of the oscillator 202) in the PLL. The amount of capacitance can be pre-selected based on the known input frequency, and subsequently can be changed if necessary if the input frequency changes. More specifically, in an embodiment, once the input frequency is known, then an amount of capacitance tuned to that input frequency can be identified and the RC filters 441, 442, and 443 can be programmed to provide that amount of capacitance. If the input frequency changes, then the process can be repeated. If the input clock frequency (the oscillator 202 frequency) increases, then the capacitance is reduced, and vice versa.

Figure 5:
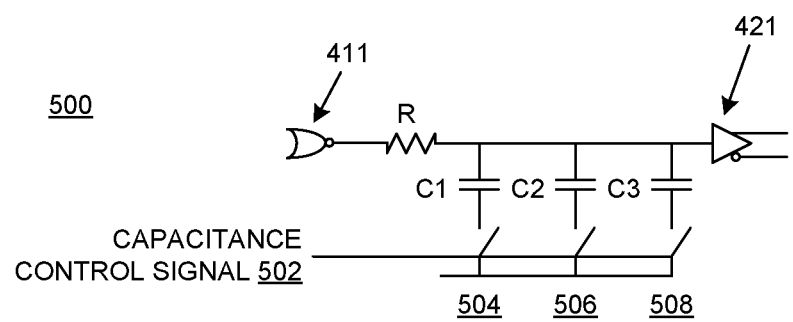
FIG. 5 illustrates circuitry for programming the amount of capacitance in a frequency divider in embodiments according to the present invention.

FIG. 5 illustrates circuitry 500 for programming the amount of capacitance in the circuitry 400 of the frequency divider 220 in embodiments according to the present invention, using the RC filter 441 as an example. In the example of FIG. 5, three capacitors C1, C2, and C3 are connected in parallel between the NOR gate 411 and the differential converter 421. That is, in the example of FIG. 5, the RC filter 441 includes the resistor R and three capacitors C1, C2, and C3. In an embodiment, the RC filters 442 and 443 are similarly configured. The capacitors C1, C2, and C3 can have the same capacitances or different capacitances. A capacitance control signal 502 (e.g., a three-bit signal) controls the switches 504, 506, and 508, which can be implemented using transistors. The switches 504, 506, and 508 can be open or closed in any combination depending on the value of the capacitance control signal 502. For example, if only the switch 504 is closed, then the capacitive load in the RC filter 441 includes only the capacitance of the capacitor C1; if only the switches 504 and 506 are closed, then the capacitive load in the RC filter 441 includes the capacitances of both of the capacitors C1 and C2; and so on. The RC filters 442 and 443 operate in the same manner. In an embodiment, the value of the capacitance control signal is automatically set depending on the input frequency and can change automatically if the input frequency changes by, for example, a specified or threshold amount. In other words, if the input frequency is within a first range, then the amount of capacitance corresponding to that range is identified and the capacitive load in each of the RC filters 441, 442, and 443 is programmed accordingly. If the input frequency changes so that it is outside the first range (e.g., in a second range outside the first range), then the amount of capacitance corresponding to the second range is identified and the capacitive load in each of the RC filters 441, 442, and 443 is programmed accordingly.

As noted above, the RC filters 442 and 443 can be configured the same as the RC filter 441. That is, the number of capacitors is the same, and the amount of capacitance per capacitor is the same. By matching the RC filters in this manner, the delays are the same along each path.

Programmable capacitances as just described advantageously result in smoother interpolation of clock signals in the circuitry 400 and make the clock signals less susceptible to noise.

Figure 6:
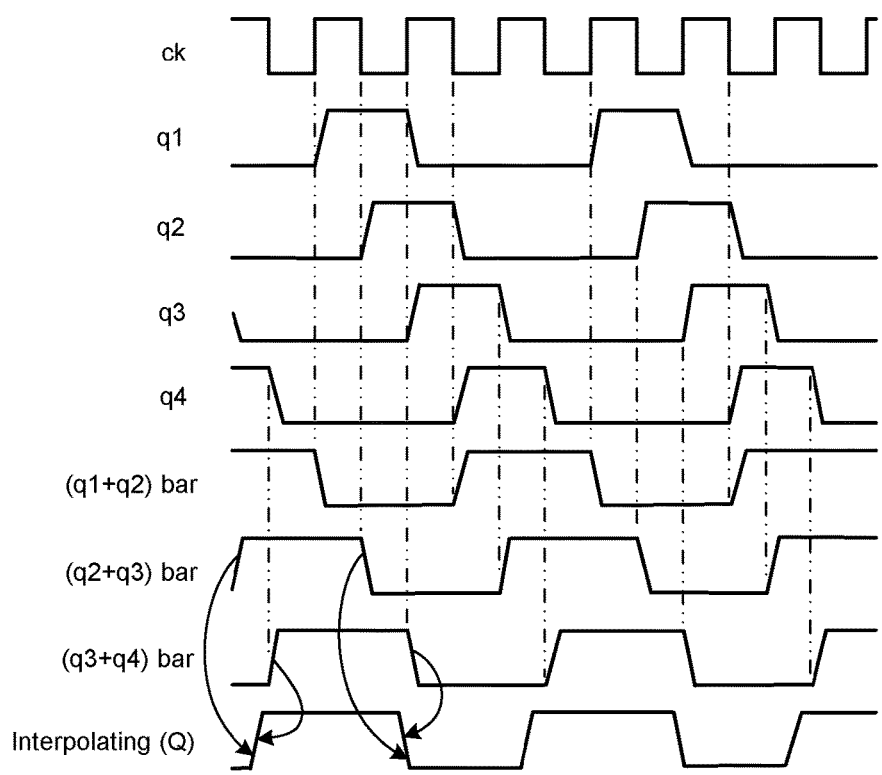
FIG. 6 illustrates examples of clock waveforms in embodiments according to the present invention.

FIG. 6 illustrates examples of clock waveforms in embodiments according to the present invention. With reference also to FIG. 4, the q1+q2(bar) waveform represents that of the in-phase clock (I) and the output of the NOR gate 411, which is input to the single-ended-to-differential converter 421. The q2+q3(bar) waveform represents the output of the NOR gate 412, and the q3+q4(bar) waveform represents the output of the NOR gate 413, which are input to the single-ended-to-differential converter 422. The interpolating (Q) waveform represents the quadrature clock generated in div3 mode; as noted above, that waveform has a 50 percent duty cycle.

Figure 7:
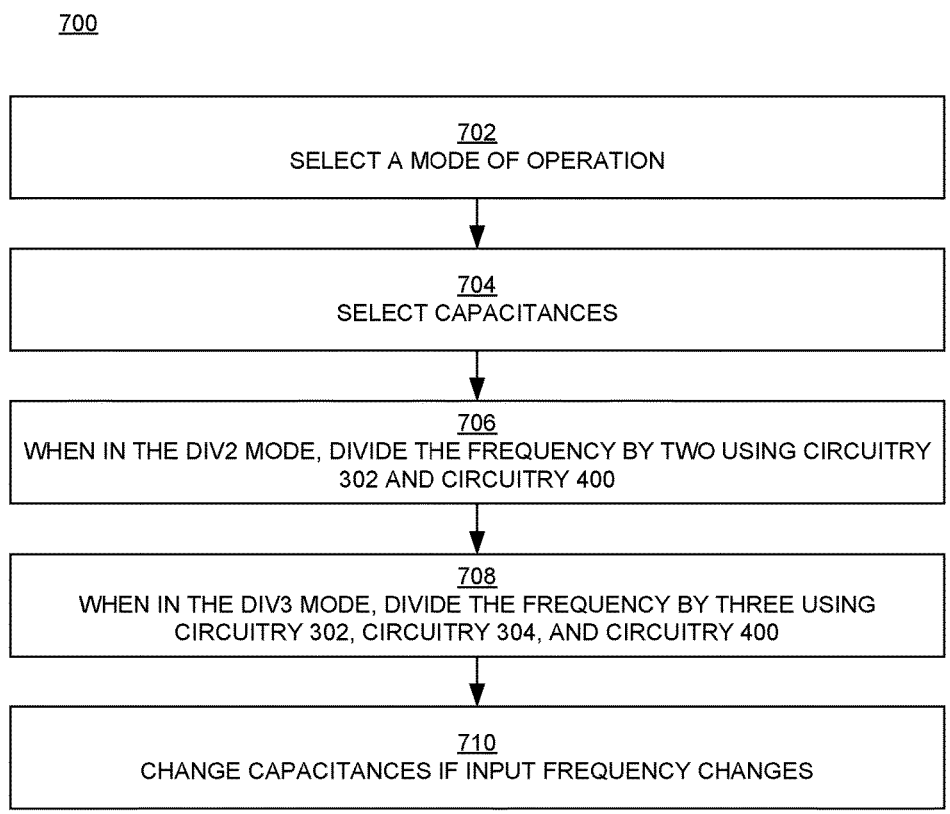
FIGS. 7 and 8 are flowcharts of methods of operating a multi-mode frequency divider in embodiments according to the present invention.

FIG. 7 is a flowchart 700 of a method of operating the multi-mode frequency divider 220 (FIGS. 2-5) in embodiments according to the present invention.

In block 702 of FIG. 7, a mode of operation for the multi-mode frequency divider 220 is selected from a first mode (the div2 mode) and a second mode (the div3 mode). The second circuitry 304 (FIG. 3) is not enabled when the multi-mode frequency divider 220 is in the first mode and is enabled when the multi-mode frequency divider is in the second mode. In an embodiment, a control signal 310 is used to implement the mode of operation by enabling/not enabling the second circuitry 304.

In block 704 of FIG. 7, the capacitances of the capacitors in the third circuitry 400 are selected according to the input frequency of the frequency divider 220 (the frequency of the clock signal generated by the oscillator 202 of the PLL 200 of FIG. 2).

In block 706 of FIG. 7, in the first mode, the frequency of the clock signal is divided by two using the first circuitry 302 (FIG. 3) and the third circuitry 400 (FIG. 4).

In block 708 of FIG. 7, in the second mode, the frequency of the clock signal is divided by three using the first circuitry 302 and the second circuitry 304 of FIG. 3 and the third circuitry 400 of FIG. 4.

In block 710 of FIG. 7, the capacitances are changed in response to a change in the frequency.

Figure 8:
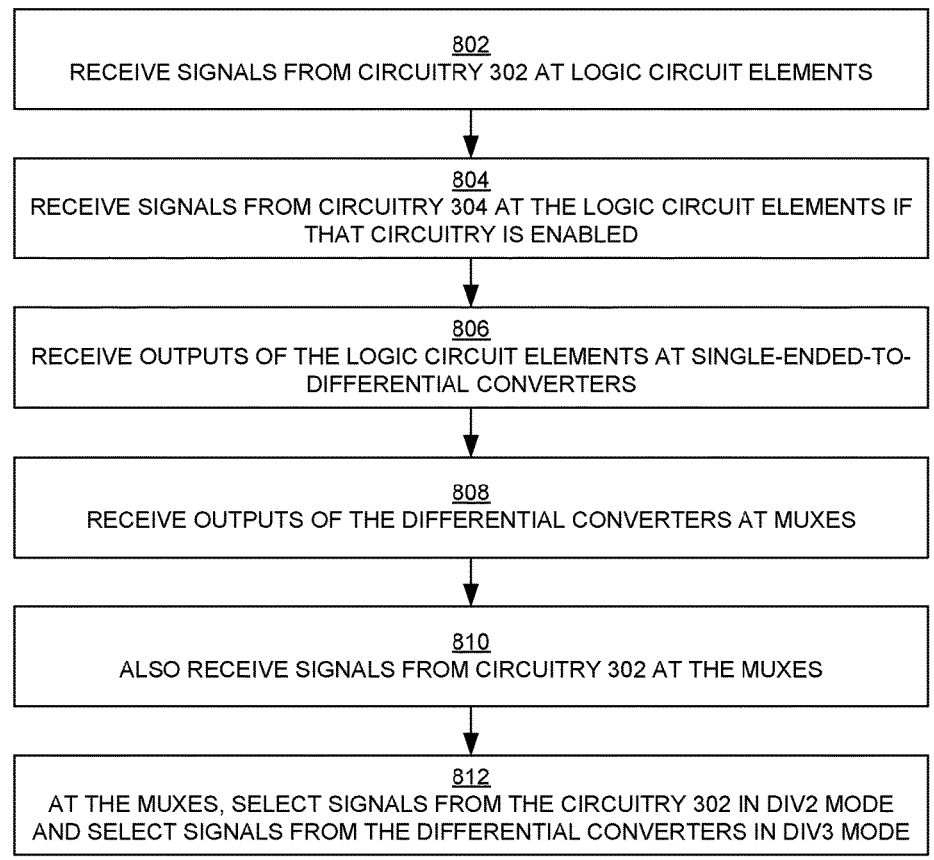

FIG. 8 is a flowchart 800 of a method of operating the third circuitry 400 of the multi-mode frequency divider 220 (FIG. 4) in embodiments according to the present invention.

In block 802 of FIG. 8, signals from the first circuitry 302 (FIG. 3) are received at the logic circuit elements (e.g., NOR gates) 411, 412, and 413 (FIG. 4).

In block 804 of FIG. 8, signals from the second circuitry 304 (FIG. 3) are also received at the logic circuit elements 411, 412, and 413 when the second circuitry is enabled.

In block 806 of FIG. 8, outputs of the logic circuit elements 411, 412, and 413 are received at the single-ended-to-differential converters 421 and 422 (FIG. 4).

In block 808 of FIG. 8, outputs of the single-ended-to-differential converters 421 and 422 are received at the multiplexers 431, 432, 433, and 434 (FIG. 4).

In block 810 of FIG. 8, the signals from the first circuitry 302 are also received at the multiplexers 431, 432, 433, and 434.

In block 812 of FIG. 8, the multiplexers 431, 432, 433, and 434 are controlled to select the signals from the first circuitry 302 when the multi-mode frequency divider 220 is in the first (div2) mode and to select the outputs of the single-ended-to-differential converters 421 and 422 when the multi-mode frequency divider is in the second (div3) mode. In an embodiment, the control signal 310 used to implement (select) the mode of operation is also used to control the multiplexers 431, 432, 433, and 434.

In summary, embodiments according to the present invention provide a multi-mode frequency divider that addresses the problems associated with conventional frequency dividers. For example, the output frequency ranges of PLLs can be expanded even with a limited VCO turning range. Multiple VCOs are not needed, so circuit overhead and PLL size are not increased as in conventional solutions, and therefore power consumption is also not increased. Significantly, the multi-mode frequency divider disclosed herein does not suffer from frequency gaps such as those associated with conventional frequency dividers. Programmable capacitances in the frequency divider result in smoother interpolation of clock signals and make the clock signals less susceptible to noise.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The example methods described and/or illustrated herein may also omit one or more of the steps described or illustrated herein or include additional steps in addition to those disclosed.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments according to the invention are thus described. While the present disclosure has been described in particular embodiments, it should be appreciated that the invention should not be construed as limited by such embodiments, but rather construed according to the following claims.

What is claimed is:

1. A device comprising a frequency divider, the device comprising:
   first circuitry;
   second circuitry coupled to the first circuitry, wherein the second circuitry is selectively enabled using a control signal and wherein the second circuitry receives a signal from the first circuitry when the second circuitry is enabled; and
   third circuitry coupled to the first circuitry and the second circuitry, wherein the third circuitry receives signals from the first circuitry and also receives signals from the second circuitry when the second circuitry is enabled, wherein the first circuitry and the third circuitry comprise a divide-by-two frequency divider when the second circuitry is not enabled, wherein the first circuitry, the second circuitry, and the third circuitry comprise a divide-by-three frequency divider when the second circuitry is enabled, and wherein the third circuitry comprises a plurality of resistors and capacitors, wherein capacitances of the capacitors are programmable.

2. The device of claim 1, wherein the capacitances are selected according to a frequency of an oscillator in a phase-locked loop comprising the frequency divider.

3. The device of claim 2, wherein the oscillator is selected from the group consisting of: a voltage-controlled oscillator and a digitally controlled oscillator.

4. The device of claim 2, wherein the capacitances are changed in response to a change in the frequency.

5. The device of claim 1, wherein the third circuitry further comprises a plurality of logic circuit elements that receives the signals from the first circuitry and that receives the signals from the second circuitry when the second circuitry is enabled.

6. The device of claim 5, wherein the third circuitry further comprises:
   a plurality of single-ended-to-differential converters, wherein each of the single-ended-to-differential converters comprises a single input and two differential outputs, wherein the plurality of single-ended-to-differential converters receives outputs from the logic circuit elements; and
   a plurality of multiplexers that receives the outputs from the single-ended-to-differential converters.

7. The device of claim 6, wherein the plurality of multiplexers also receives the control signal and the signals from the first circuitry, wherein the control signal causes the multiplexers to select the signals from the first circuitry when the second circuitry is not enabled and causes the multiplexers to select the outputs from the single-ended-to-differential converters when the second circuitry is enabled.

8. The device of claim 6, wherein the outputs from the single-ended-to-differential converters have a 50 percent duty cycle in quadrature phase and a frequency that is a frequency of an oscillator in a phase-locked loop divided by three.

9. A phase-locked loop (PLL), comprising:
an oscillator; and
a multi-mode frequency divider coupled to the oscillator, wherein the multi-mode frequency divider is operable in a first mode as a divide-by-two frequency divider and is also operable in a second mode as a divide-by-three frequency divider, wherein a control signal is used to select between operation in the first mode and operation in the second mode, wherein the multi-mode frequency divider comprises first circuitry, second circuitry, and third circuitry; wherein the second circuitry is not enabled and the first circuitry and the third circuitry comprise the divide-by-two frequency divider when the multi-mode frequency divider is in the first mode, and wherein the second circuitry is enabled and the first circuitry, the second circuitry, and the third circuitry comprise the divide-by-three frequency divider when the multi-mode frequency divider is in the second mode; wherein further the third circuitry comprises a plurality of resistors and capacitors, wherein capacitances of the capacitors are programmable.

10. The PLL of claim 9, wherein the capacitances are selected according to a frequency of the oscillator.

11. The PLL of claim 10, wherein the oscillator is selected from the group consisting of: a voltage-controlled oscillator and a digitally controlled oscillator.

12. The PLL of claim 10, wherein the capacitances are changed in response to a change in the frequency.

13. The PLL of claim 9, wherein the third circuitry further comprises a plurality of logic circuit elements that receives signals from the first circuitry in the first and second modes and that receives signals from the second circuitry in the second mode.

14. The PLL of claim 13, wherein the third circuitry further comprises:
a plurality of single-ended-to-differential converters, wherein each of the single-ended-to-differential converters comprises a single input and two differential outputs, wherein the plurality of single-ended-to-differential converters receives outputs from the logic circuit elements; and
a plurality of multiplexers that receives the outputs from the single-ended-to-differential converters.

15. The PLL of claim 14, wherein the plurality of multiplexers also receives the control signal and the signals from the first circuitry, wherein the multiplexers select the signals from the first circuitry in the first mode according to the control signal, and wherein the multiplexers select the outputs from the single-ended-to-differential converters in the second mode according to the control signal.

16. A method of operating a multi-mode frequency divider in a phase-locked loop (PLL), the method comprising:

selecting a mode of operation for the multi-mode frequency divider from a first mode and a second mode, wherein the multi-mode frequency divider comprises first circuitry, second circuitry, and third circuitry, wherein the second circuitry is not enabled when the multi-mode frequency divider is in the first mode and is enabled when the multi-mode frequency divider is in the second mode, wherein further the third circuitry comprises a plurality of resistors and capacitors and capacitances of the capacitors are programmable;
selecting the capacitances of the capacitors according to a frequency of a clock signal generated by an oscillator of the PLL;
in the first mode, dividing the frequency of the clock signal by two using the first circuitry and the third circuitry; and
in the second mode, dividing the frequency of the clock signal by three using the first circuitry, the second circuitry, and the third circuitry.

17. The method of claim 16, further comprising changing the capacitances in response to a change in the frequency.

18. The method of claim 16, wherein the third circuitry comprises a plurality of logic circuit elements and a plurality of single-ended-to-differential converters, wherein each of the single-ended-to-differential converters comprises a single input and two differential outputs, wherein the method further comprises:
receiving signals from the first circuitry at the logic circuit elements;
receiving signals from the second circuitry at the logic circuit elements when the second circuitry is enabled; and
receiving outputs of the logic circuit elements at the single-ended-to-differential converters.

19. The method of claim 18, wherein the third circuitry further comprises a plurality of multiplexers, wherein the method further comprises:
receiving outputs of the single-ended-to-differential converters at the multiplexers;
receiving the signals from the first circuitry at the multiplexers; and
controlling the multiplexers to select the signals from the first circuitry when the multi-mode frequency divider is in the first mode and to select the outputs of the single-ended-to-differential converters when the multi-mode frequency divider is in the second mode.

20. The method of claim 19, further comprising using a control signal both to implement the mode of operation and to control the multiplexers.

* * * * *